(12) United States Patent
Kim et al.

(10) Patent No.: US 9,368,515 B2
(45) Date of Patent: Jun. 14, 2016

(54) THIN FILM TRANSISTOR ARRAY PANEL AND METHOD OF MANUFACTURING THE SAME

(71) Applicant: SAMSUNG DISPLAY CO., LTD., Yongin, Gyeonggi-Do (KR)

(72) Inventors: Dong Jo Kim, Yongin-si (KR); Ji Seon Lee, Hwaseongi-si (KR); Jong Chan Lee, Suwon-si (KR); Yoon Ho Khang, Yongin-si (KR); Sang Ho Park, Suwon-si (KR); Yong Su Lee, Hwaseong-si (KR); Jung Kyu Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/070,886

(22) Filed: Nov. 4, 2013

(65) Prior Publication Data
US 2014/0175429 A1    Jun. 26, 2014

(30) Foreign Application Priority Data
Dec. 21, 2012 (KR) .................. 10-2012-0151131

(51) Int. Cl.
*H01L 27/12* (2006.01)
(52) U.S. Cl.
CPC .......... *H01L 27/1225* (2013.01); *H01L 27/127* (2013.01); *H01L 27/1214* (2013.01); *H01L 27/1288* (2013.01)
(58) Field of Classification Search
None
See application file for complete search history.

(56) References Cited

U.S. PATENT DOCUMENTS

| 5,523,865 A | 6/1996 | Furuta et al. |
| 6,013,930 A * | 1/2000 | Yamazaki et al. ............ 257/353 |
| 6,445,003 B1 * | 9/2002 | Chang et al. .................... 257/59 |
| 6,762,813 B1 | 7/2004 | Zhang et al. |
| 7,782,416 B2 | 8/2010 | Seo et al. |
| 7,804,091 B2 * | 9/2010 | Takechi et al. .................. 257/59 |
| 2002/0180900 A1 * | 12/2002 | Chae et al. ...................... 349/43 |

(Continued)

FOREIGN PATENT DOCUMENTS

| JP | 2007-220816 | 8/2007 |
| JP | 2010-102220 | 5/2010 |

(Continued)

OTHER PUBLICATIONS

"The thin film transistor" in The Penguin Dictionary of Physics, © Market House Books Ltd, 2009.*

*Primary Examiner* — Johannes P Mondt
(74) *Attorney, Agent, or Firm* — F. Chau & Associates, LLC

(57) ABSTRACT

A thin film transistor array panel may include a channel layer including an oxide semiconductor and formed in a semiconductor layer, a source electrode formed in the semiconductor layer and connected to the channel layer at a first side, a drain electrode formed in the semiconductor layer and connected to the channel layer at an opposing second side, a pixel electrode formed in the semiconductor layer in a same portion of the semiconductor layer as the drain electrode, an insulating layer disposed on the channel layer, a gate line including a gate electrode disposed on the insulating layer, a passivation layer disposed on the source and drain electrodes, the pixel electrode, and the gate line, and a data line disposed on the passivation layer. A width of the channel layer may be substantially equal to a width of the pixel electrode in a direction parallel to the gate line.

30 Claims, 10 Drawing Sheets

(56) References Cited

U.S. PATENT DOCUMENTS

| | | | |
|---|---|---|---|
| 2007/0215945 A1* | 9/2007 | Tokunaga et al. | 257/347 |
| 2008/0197356 A1 | 8/2008 | Kim et al. | |
| 2010/0084654 A1 | 4/2010 | Yamazaki et al. | |
| 2010/0224872 A1 | 9/2010 | Kimura | |
| 2012/0217493 A1* | 8/2012 | Lee et al. | 257/43 |
| 2012/0302055 A1* | 11/2012 | Pore et al. | 438/608 |
| 2013/0134391 A1* | 5/2013 | Afzali-Ardakani et al. | 257/29 |
| 2013/0207087 A1* | 8/2013 | Kim | H01L 27/3225 257/40 |

FOREIGN PATENT DOCUMENTS

| | | |
|---|---|---|
| JP | 2011-039314 | 2/2011 |
| KR | 1020080057878 | 6/2008 |
| KR | 101051586 | 7/2011 |
| KR | 1020120062376 | 6/2012 |
| KR | 1020130111872 | 10/2013 |

\* cited by examiner

THIN FILM TRANSISTOR ARRAY PANEL AND METHOD OF MANUFACTURING THE SAME

CROSS-REFERENCE TO RELATED APPLICATION

This application claims priority under 35 U.S.C. §119 to Korean Patent Application No. 10-2012-0151131, filed on Dec. 21, 2012, the disclosure of which incorporated by reference herein in its entirety.

TECHNICAL FIELD

Exemplary embodiments of the present invention relate to a thin film transistor array panel and a method of manufacturing the same.

DISCUSSION OF THE RELATED ART

A thin film transistor (TFT) is used in various electronic devices such as, for example, flat panel displays. More specifically, the thin film transistor may be used as a switching element or a driving element in a flat panel display such as, for example, a liquid crystal display (LCD), an organic light emitting diode (OLED) display, or an electrophoretic display.

The thin film transistor includes a gate electrode connected to a gate line that transmits a scanning signal, a source electrode connected to a data line that transmits a signal to be applied to a pixel electrode, a drain electrode that faces the source electrode, and a semiconductor electrically connected to the source electrode and the drain electrode. The thin film transistor may utilize silicon (Si), including amorphous silicon and polysilicon, to form the semiconductor, or the thin film transistor may utilize an oxide semiconductor.

SUMMARY

Exemplary embodiments of the present invention provide a thin film transistor array panel and a method of manufacturing the same. According to exemplary embodiments, the parasitic capacitance between a gate electrode of a thin film transistor, which includes an oxide semiconductor, and a source electrode, or the parasitic capacitance between the gate electrode and a drain electrode, may be decreased, improving characteristics of the thin film transistor by broadening a width of a channel of the thin film transistor and shortening a length thereof, and decreasing deterioration of an aperture ratio of the thin film transistor array panel.

An exemplary embodiment of the present invention provides a thin film transistor array panel including a channel layer formed of an oxide semiconductor, a source electrode and a drain electrode, which are connected to the channel layer and face each other at both sides based on the channel layer, a pixel electrode formed of the same layer as the drain electrode, an insulating layer positioned on the channel layer, a gate line including a gate electrode which is positioned on the insulating layer, a passivation layer positioned on the source electrode, the drain electrode, the pixel electrode, and the gate line, and a data line positioned on the passivation layer. A width of the channel layer may be the same as a width of the pixel electrode which extends in a direction parallel to the gate line.

A length of the channel layer may be the same as a width of the gate electrode which extends in a direction parallel to the data line.

The source electrode, the drain electrode, and the pixel electrode may include a reducing substance reduced from a material of an oxide semiconductor forming the channel layer.

An edge boundary of the gate electrode and an edge boundary of the insulating layer may be substantially aligned.

The passivation layer may have a contact hole which exposes the source electrode, and the data line may be connected to the source electrode through the contact hole.

The contact hole may be formed at a position where the data line is overlapped.

According to an exemplary embodiment of the present invention, a method of manufacturing a thin film transistor array panel includes laminating an oxide semiconductor layer on an insulation substrate, forming an insulating layer and a gate line including a gate electrode on the oxide semiconductor layer, forming a channel layer which is covered by the gate electrode, a source electrode and a drain electrode which face each other based on the channel layer, and a pixel electrode which is formed of the same layer as the drain electrode, by performing a reduction process on the semiconductor layer which is exposed without being covered by the insulating layer and the gate line, forming a passivation layer on the source electrode, the drain electrode, the pixel electrode, and the gate line, and forming a data line on the passivation layer.

In forming the channel layer, a width of the channel may be formed to be the same as a width of the pixel electrode which extends in a direction parallel to the gate line, and a length of the channel layer may be formed to be the same as a width of the gate electrode which extends in a direction parallel to the data line.

The forming of the source electrode, the drain electrode, and the pixel electrode may include performing a plasma process on a material of an oxide semiconductor forming the channel layer to reduce the material.

The forming of the gate line including the insulating layer and the gate electrode may include laminating an insulating material layer including an insulating material on the oxide semiconductor layer, forming a gate line including the gate electrode on the insulating material layer, and exposing a part of the oxide semiconductor layer by forming the insulating layer by patterning the insulating material layer by using the gate electrode as an etching mask.

The forming of the passivation layer may further include forming a contact hole, which exposes the source electrode, at the passivation layer, and the forming of the data line may include connecting the source electrode and the data line through the contact hole.

The forming of the contact hole may include forming the contact hole at a position where the data line is overlapped.

According to an exemplary embodiment of the present invention, a thin film transistor array panel includes a channel layer including an oxide semiconductor and formed in a semiconductor layer, a source electrode formed in the semiconductor layer and connected to the channel layer at a first side of the channel layer, a drain electrode formed in the semiconductor layer and connected to the channel layer at a second side of the channel layer, opposing the first side, a pixel electrode formed in the semiconductor layer in a same portion of the semiconductor layer as the drain electrode, an insulating layer disposed on the channel layer, a gate line including a gate electrode disposed on the insulating layer, a passivation layer disposed on the source electrode, the drain electrode, the pixel electrode, and the gate line, and a data line disposed on the passivation layer. A width of the channel layer may be substantially equal to a width of the pixel electrode in a direction parallel to the gate line.

According to an exemplary embodiment of the present invention, a method of manufacturing a thin film transistor array panel includes forming an oxide semiconductor layer on an insulation substrate, forming an insulating layer and a gate line including a gate electrode on the oxide semiconductor layer, forming a channel layer, a source electrode, a drain electrode, and a pixel electrode in the oxide semiconductor layer by performing a reduction process on an exposed portion of the oxide semiconductor layer, wherein the channel layer is covered by the gate electrode, the source electrode is formed at a first side of the channel layer, the drain electrode is formed at a second side of the channel layer, opposing the first side, the pixel electrode and the drain electrode are formed in a same portion of the oxide semiconductor layer, and the exposed portion of the oxide semiconductor layer is not covered by the insulating layer and the gate line, forming a passivation layer on the source electrode, the drain electrode, the pixel electrode, and the gate line, and forming a data line on the passivation layer. A width of the channel layer is formed to be substantially equal to a width of the pixel electrode in a direction parallel to the gate line.

According to an exemplary embodiment of the present invention, a thin film transistor array panel includes a channel layer including an oxide semiconductor and formed in a semiconductor layer, a gate electrode formed on the channel layer, a source electrode formed in the semiconductor layer and connected to the channel layer at a first side of the channel layer, a drain electrode formed in the semiconductor layer and connected to the channel layer at a second side of the channel layer, opposing the first side, and a pixel electrode formed in the semiconductor layer in a same portion of the semiconductor layer as the drain electrode.

The thin film transistor array panel and the method of manufacturing the same according to exemplary embodiments of the present invention may decrease parasitic capacitance between a gate electrode of a thin film transistor, which includes an oxide semiconductor, and a source electrode, or parasitic capacitance between the gate electrode and a drain electrode, improve characteristics of the thin film transistor by broadening a width of a channel of the thin film transistor and shortening a length thereof, and decrease deterioration of an aperture ratio of the thin film transistor array panel.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
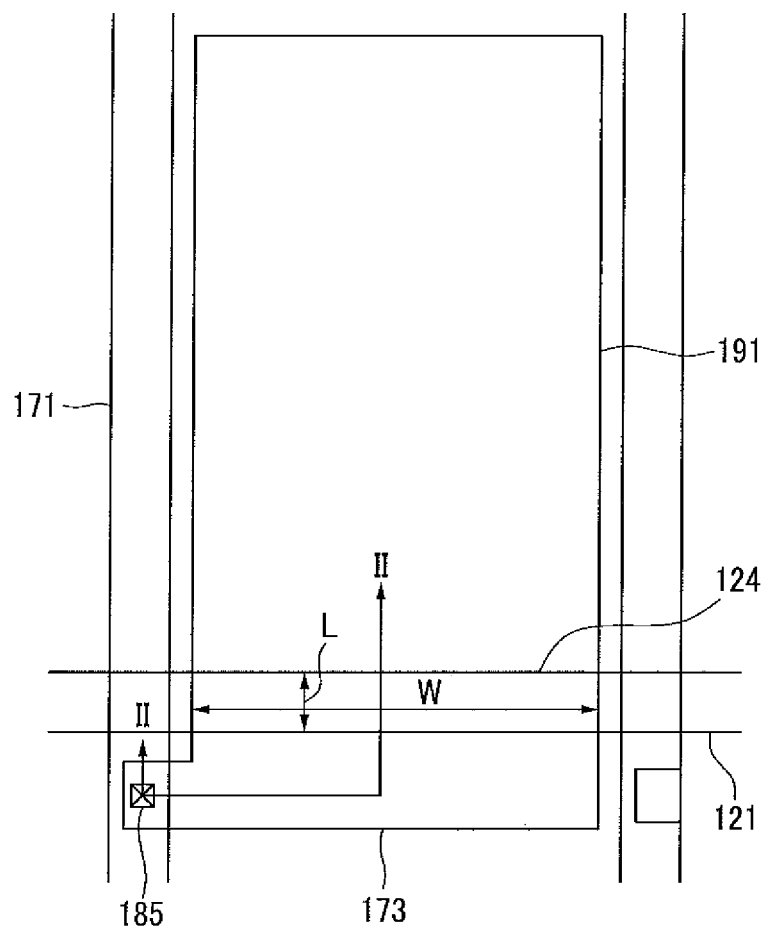
FIG. 1 is a layout view of a thin film transistor array panel, according to an exemplary embodiment of the present invention.

Exemplary embodiments of the present invention will be described more fully hereinafter with reference to the accompanying drawings. Like reference numerals may refer to like elements throughout the accompanying drawings.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Figure 2:
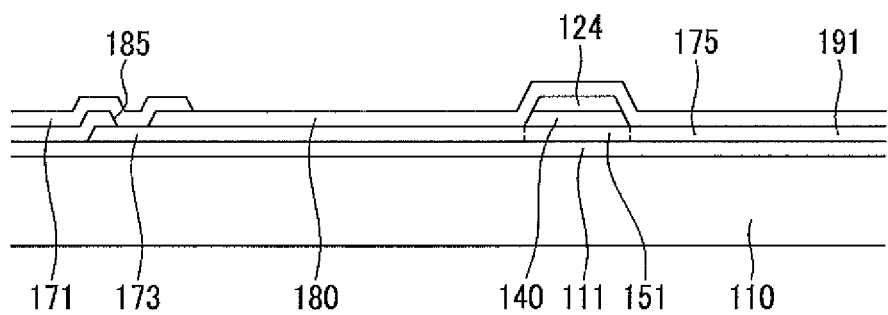
FIG. 2 is a cross-sectional view of the thin film transistor array panel taken along line II-II of FIG. 1, according to an exemplary embodiment of the present invention.

A thin film transistor array panel according to an exemplary embodiment of the present invention will be described with reference to FIGS. 1 and 2. FIG. 1 is a layout view of a thin film transistor array panel according to an exemplary embodiment of the present invention. FIG. 2 is a cross-sectional view of the thin film transistor array panel taken along line II-II of FIG. 1.

Referring to FIGS. 1 and 2, a buffer layer 111 is positioned on an insulation substrate 110. The insulation substrate 110 may be made of, for example, glass, plastic, etc. The buffer layer 111 may include insulating oxide such as, for example, silicon oxide (SiOx), aluminum oxide ($Al_2O_3$), hafnium oxide ($HfO_3$), yttrium oxide ($Y_2O_3$), etc. The buffer layer 111 prevents or reduces an inflow of impurities from the insulation substrate 110 to a semiconductor to be laminated thereafter, and thus, may protect the semiconductor and may improve interface characteristics of the semiconductor.

A light blocking film may be positioned between the insulation substrate 110 and the buffer layer 111. The light blocking film may prevent or substantially prevent light from reaching an oxide semiconductor to be laminated thereafter, and thus may prevent the oxide semiconductor from losing its semiconductor properties. Therefore, the light blocking film may be made of a material that does not transmit light having a wavelength band to be blocked, such that the light does not reach the oxide semiconductor. The light blocking film may be made of a conductive material such as, for example, an organic insulating material, an inorganic insulating material, a metal, etc., and the light blocking film may have a single layer or multiple layers.

A channel layer 151, a source electrode 173, a drain electrode 175, and a pixel electrode 191 are formed in a semiconductor layer disposed on the buffer layer 111. The pixel electrode 191 is formed in the same portion of the semiconductor layer as the drain electrode 175, as shown in FIG. 2.

The channel layer 151 may include an oxide semiconductor material, forming a metal oxide semiconductor. The metal oxide semiconductor may include an oxide semiconductor material that is formed of oxide of a metal such as, for example, zinc (Zn), indium (In), gallium (Ga), tin (Sn), titanium (Ti), etc., or a combination of a metal such as zinc (Zn), indium (In), gallium (Ga), tin (Sn), titanium (Ti), etc., and oxide thereof. For example, the oxide semiconductor material may include at least one of zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), etc.

Referring to FIG. 2, the source electrode 173 and the drain electrode 175 are positioned at both sides of the channel layer 151, respectively, and are separated from each other by the channel layer 151. In addition, the source electrode 173 and the drain electrode 175 are connected to the channel layer 151. The pixel electrode 191 is connected to the drain electrode 175 and is formed in the same portion of the semiconductor layer as the drain electrode 175.

The source electrode 173, the drain electrode 175, and the pixel electrode 191 are conductive, and may include the same material as the semiconductor material which forms the channel layer 151, and a reduced semiconductor material. When the reduced substance is reduced by way of, for example, a reduction process (e.g., a plasma reduction process), a metal included in the semiconductor material such as, for example, indium (In), may be precipitated at surfaces of the source electrode 173, the drain electrode 175, and the pixel electrode 191.

An insulating layer 140 is positioned on the channel layer 151. The insulating layer 140 covers the channel layer 151, and is not overlapped with the source electrode 173, the drain electrode 175, and the pixel electrode 191.

The insulating layer 140 may be formed of a single layer or multiple layers.

When the insulating layer 140 is a single layer, the insulating layer 140 may include insulating oxide such as, for example, silicon oxide (SiOx), aluminum oxide ($Al_2O_3$), hafnium oxide ($HfO_3$), yttrium oxide ($Y_2O_3$), etc. The insulating layer 140 may improve interface characteristics of the semiconductor material of the channel layer 151, and may prevent or substantially prevent impurities from permeating into the channel layer 151.

When the insulating layer 140 is formed of multiple layers, the insulating layer 140 may include a lower layer including insulating oxide such as, for example, silicon oxide (SiOx), aluminum oxide ($Al_2O_3$), hafnium oxide ($HfO_3$), yttrium oxide ($Y_2O_3$), etc., which may improve interface characteristics of the semiconductor material of the channel layer 151 and may prevent or substantially prevent impurities from permeating into the channel layer 151, and an upper layer made of various insulating materials such as, for example, silicon nitride (SiNx).

A thickness of the insulating layer 140 may be greater than or equal to about 1000 Å and less than or equal to about 5000 Å, however exemplary embodiments of the present invention are not limited thereto.

A gate line 121 including a gate electrode 124 is positioned on the insulating layer 140. An edge boundary of the gate electrode 124 and an edge boundary of the insulating layer 140 may be aligned so as to substantially coincide with each other, as shown in FIG. 2.

The gate electrode 124 includes a portion that is overlapped with the channel layer 151, and the channel layer 151 is covered by the gate electrode 124, as shown in FIG. 2. The source electrode 173 and the drain electrode 175 are positioned at both sides of the channel layer 151 based on the location of the gate electrode 124. The source electrode 173 and the drain electrode 175 may not be substantially overlapped with the gate electrode 124. As a result, parasitic capacitance between the gate electrode 124 and the source electrode 173, or parasitic capacitance between the gate electrode 124 and the drain electrode 175, may be decreased.

The gate electrode 124 may be made of a metal such as, for example, aluminum (Al), silver (Ag), copper (Cu), molybdenum (Mo), chromium (Cr), tantalum (Ta), titanium (Ti), etc., or an alloy thereof. The gate electrode 124 may have a single layered structure or a multilayered structure. Examples of the multilayered structure may include, for example, a dual layer including a lower layer made of, for example, titanium (Ti), tantalum (Ta), molybdenum (Mo), ITO, etc., and an upper layer including, for example, copper (Cu), and a triple layer including, for example, molybdenum (Mo)-aluminum (Al)-molybdenum (Mo). However, exemplary embodiments of the gate electrode 124 are not limited thereto, and the gate electrode 124 may be made of various metals or conductors.

In the thin film transistor array panel according to the exemplary embodiment shown in FIGS. 1 and 2, a boundary between the channel layer 151 and the source electrode 173, or a boundary between the channel layer 151 and the drain electrode 175, may be substantially aligned to coincide with the edge boundaries of the gate electrode 124 and the insulating layer 140. However, exemplary embodiments are not limited thereto. For example, in an exemplary embodiment, the boundary between the channel layer 151 and the source electrode 173 or the boundary between the channel layer 151 and the drain electrode 175 may be positioned slightly inward from the edge boundaries of the gate electrode 124 and the insulating layer 140.

The gate electrode 124, the source electrode 173, and the drain electrode 175 form a thin film transistor (TFT) together with the channel layer 151.

As shown in FIG. 1, a width of a channel of the thin film transistor is the same as or substantially the same as a width W of the pixel electrode 191 in a direction parallel to a direction in which the gate line 121 extends, and a length of the channel of the thin film transistor is the same as or substantially the same as a width L of the gate electrode 124 of the gate lines 121, which is overlapped with the channel layer 151.

The thin film transistor array panel according to the exemplary embodiment shown in FIGS. 1 and 2 includes the source electrode 173 and the drain electrode 175, which are positioned on the same layer as the channel layer 151 and connected to each other. As a result, the width of the channel of the thin film transistor may be increased, and the length of the channel may be decreased. Increasing the width of the channel and decreasing the length of the channel may improve characteristics of the thin film transistor, and may decrease deterioration of an aperture ration of the thin film transistor array panel.

A passivation layer 180 may be positioned on the gate electrode 124, the source electrode 173, the drain electrode 175, and the buffer layer 111. The passivation layer 180 may be made of an inorganic insulating material or an organic insulating material such as, for example, silicon nitride, silicon oxide, etc. The passivation layer 180 has a contact hole 185 that exposes the source electrode 173.

A data line 171 is positioned on the passivation layer 180. The data line 171 is electrically connected to the source electrode 173 of the thin film transistor through the contact hole 185 of the passivation layer 180. The contact hole 185 may be formed at a position where the data line 171 overlaps the passivation layer 180 and the source electrode 173. As a result, an aperture ratio of a liquid crystal display may be prevented from deteriorating due to the contact hole 185.

The thin film transistor array panel according to the exemplary embodiment shown in FIGS. 1 and 2 includes the pixel electrode 191, which is formed in the same semiconductor layer as the channel layer 151 and formed in the same portion of the semiconductor layer as the drain electrode 175. As a result of this configuration, the drain electrode 175 and the pixel electrode 191 are connected to each other without utilizing a contact hole. As a result, deterioration of an aperture ratio of the thin film transistor array panel may be prevented. Moreover, the contact hole 185 of the passivation layer 180, which is used to connect the source electrode 173 and the data line 171 of the thin film transistor array panel to each other, may be formed at a position where the data line 171 is overlapped. As a result, deterioration of an aperture ratio of a liquid crystal display due to the contact hole 185 may be prevented.

Referring to the thin film transistor array panel according to the exemplary embodiment shown in FIGS. 1 and 2, because the gate electrode 124 of the thin film transistor, which includes the channel layer 151 formed of the oxide semiconductor, is not overlapped with the source electrode 173 or the drain electrode 175, parasitic capacitance between the gate electrode 124 and the source electrode 173, or parasitic capacitance between the gate electrode 124 and the drain electrode 175, may be decreased.

In addition, the width of the channel of the thin film transistor is the same as or substantially the same as the width W of the pixel electrode 191 in a direction parallel to a direction in which the gate line 121 extends. Further, the length of the channel of the thin film transistor is the same as or substantially the same as the width L of the gate electrode 124 of the gate lines 121, which is overlapped with the channel layer 151. As a result of the width of the channel of the thin film transistor being increased and the length being decreased, characteristics of the thin film transistor may be improved, and deterioration of an aperture ratio of the thin film transistor array panel may be decreased.

In addition, because the pixel electrode 191 is formed in the same semiconductor layer as the channel layer 151 and formed in the same portion of the semiconductor layer as the drain electrode 175, the drain electrode 175 and the pixel electrode 191 may be connected to each other without utilization of a contact hole. As a result, deterioration of an aperture ratio of the thin film transistor array panel may be prevented.

Moreover, the contact hole 185 of the passivation layer 180, which connects the source electrode 173 and the data line 171 of the thin film transistor array panel, may be formed at a position where the data line 171 is overlapped. As a result, deterioration of an aperture ratio of a liquid crystal display due to the contact hole 185 may be prevented.

A method of manufacturing the thin film transistor array panel according to an exemplary embodiment of the present invention will be described with reference to FIGS. 3 to 10, as well as FIGS. 1 and 2. FIGS. 3, 5, 7, and 9 are layout views illustrating a method of manufacturing the thin film transistor array panel, which is illustrated in FIG. 1, in accordance with a method of manufacturing the thin transistor array panel according to an exemplary embodiment of the present invention in sequence. FIG. 4 is a cross-sectional view of the thin film transistor array panel taken along line IV-IV of FIG. 3. FIG. 6 is a cross-sectional view of the thin film transistor array panel taken along line VI-VI of FIG. 5. FIGS. 8A and 8B are cross-sectional views of the thin film transistor array panel taken along line VIII-VIII of FIG. 7, and illustrate a method of manufacturing the thin film transistor array panel of FIG. 7 in sequence. FIG. 10 is a cross-sectional view of the thin film transistor array panel taken along line X-X of FIG. 9.

Figure 3:
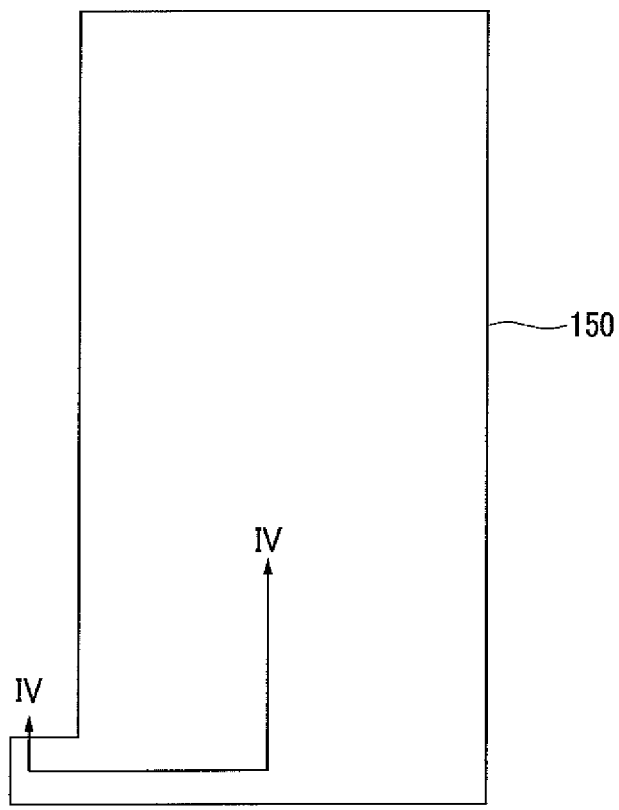
FIGS. 3, 5, 7, and 9 are layout views illustrating a method of manufacturing the thin film transistor array panel of FIG. 1, according to an exemplary embodiment of the present invention.
Figure 4:
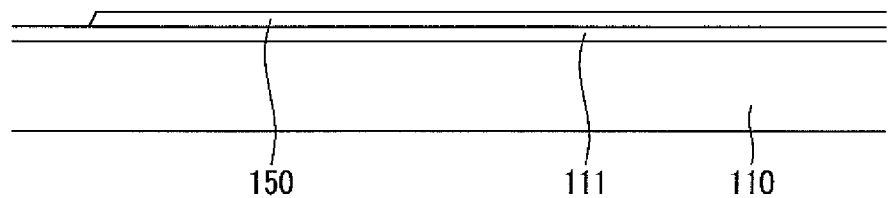
FIG. 4 is a cross-sectional view of the thin film transistor array panel taken along line IV-IV of FIG. 3, according to an exemplary embodiment of the present invention.

As illustrated in FIGS. 3 and 4, the buffer layer 111, which is formed of an insulating material including oxide such as, for example, silicon oxide (SiOx), aluminum oxide (Al2O3), hafnium oxide (HfO3), yttrium oxide (Y2O3), etc., is formed on the insulation substrate 110 that may be made of, for example, glass, plastic, etc., by a method such as, for example, chemical vapor deposition (CVD). The light blocking film, which is made of a conductive material such as, for example, an organic insulating material, an inorganic insulating material, a metal, etc., may be formed before the buffer layer 111 is formed.

The oxide semiconductor layer 150 is laminated on the buffer layer 111.

As evident from FIG. 4, the oxide semiconductor layer 150 is planar. The oxide semiconductor layer 150 is formed of an oxide semiconductor material such as, for example, zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), etc.

Figure 5:
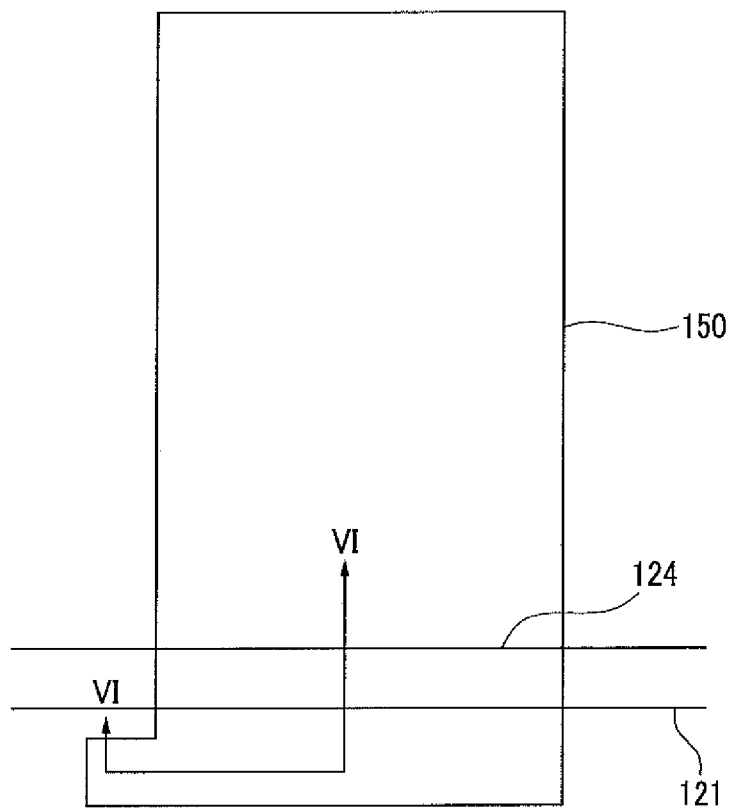
Figure 6:
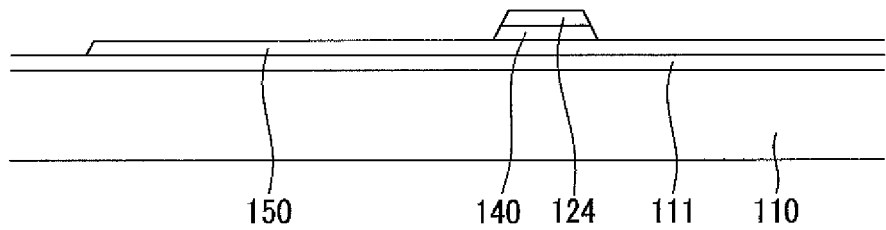
FIG. 6 is a cross-sectional view of the thin film transistor array panel taken along line VI-VI of FIG. 5, according to an exemplary embodiment of the present invention.

Referring to FIGS. 5 and 6, the insulating layer 140 is then formed on the oxide semiconductor layer 150. The insulating layer 140 may be formed of a single layer including an insulating oxide such as, for example, silicon oxide (SiOx), or may be formed of multiple layers including, for example, a lower layer including an insulating oxide such as, for example, silicon oxide (SiOx), and an upper layer including an insulating material. The thickness of the insulating layer 140 may be greater than or equal to about 1000 Å and less than or equal to about 5000 Å, however, exemplary embodiments of the present invention are not limited thereto.

The gate line 121 including the gate electrode 124 is formed by laminating and patterning a conductive material of metal on the insulating layer 140.

The gate line 121 and the insulating layer 140 may be formed by a single photolithography process. For example, after an insulating material layer, which forms the insulating layer 140, and a conductive material layer, which forms the gate line 121, are sequentially laminated, the gate line 121 including the gate electrode 124 may be formed by performing photolithography on the conductive material layer. The insulating layer 140 may then be formed by etching the insulating material layer using the gate line 121 as an etching mask. Accordingly, the gate line 121 including the gate electrode 124 and the insulating layer 140 may have substantially the same flat surface shape.

Figure 7:
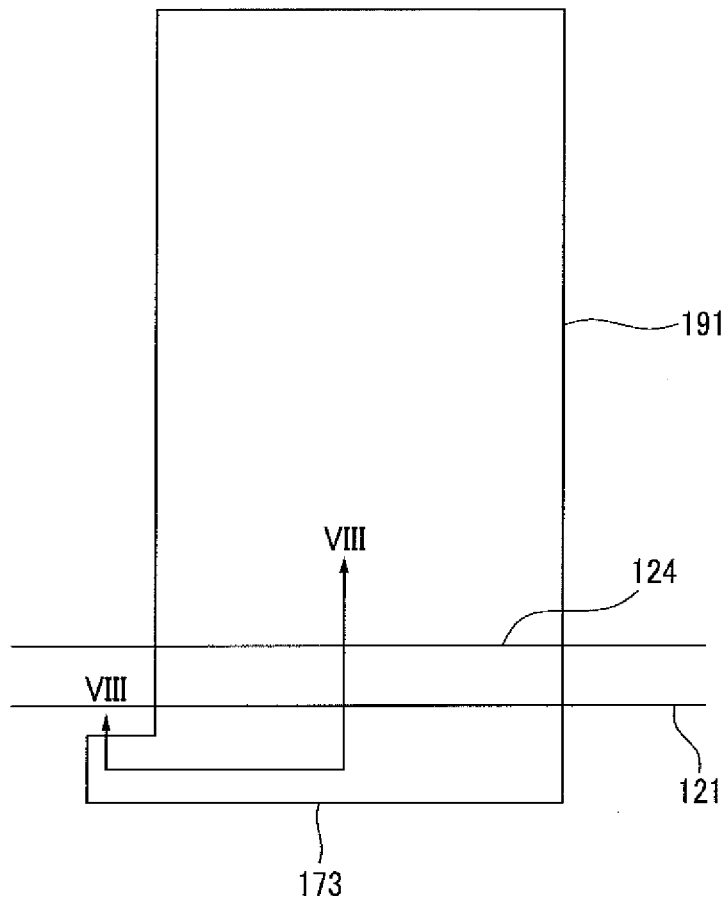
Figure 8A:
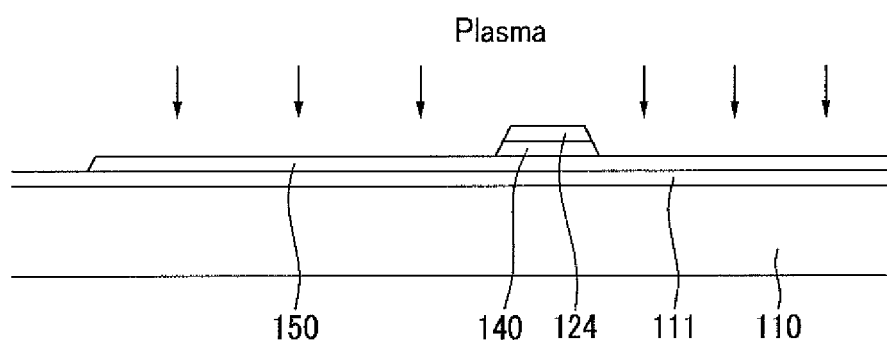
FIGS. 8A and 8B are cross-sectional views of the thin film transistor array panel taken along line VIII-VIII of FIG. 7, and illustrate a method of manufacturing the thin film transistor array panel of FIG. 7, according to an exemplary embodiment of the present invention.
Figure 8B:
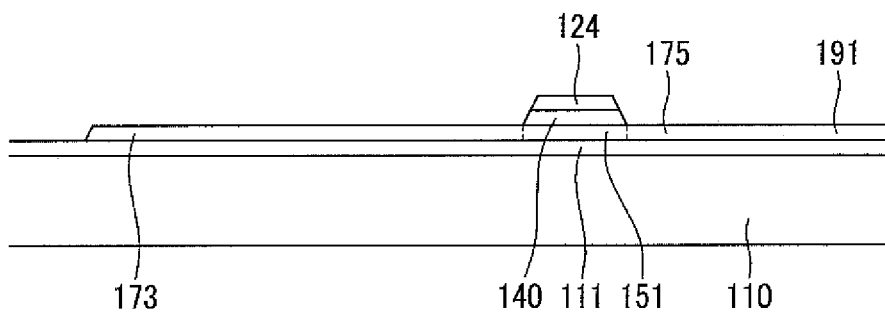

Referring to FIGS. 7, 8A and 8B, the source electrode 173, the drain electrode 175, and the pixel electrode 191, which are conductive, are then formed by reducing a portion of the planar oxide semiconductor layer 150 that is exposed without being covered by the gate line 121. At this time, a portion of the oxide semiconductor layer 150, which is covered by the gate electrode 124 of the gate line 121, is not processed for reduction, and becomes the channel layer 151 of the thin film transistor.

For example, as illustrated in FIG. 8A, the portion of the oxide semiconductor layer 150 that is exposed without being covered by the gate electrode 124 of the gate line 121 is processed by plasma. The plasma may include hydrogen based gas or fluorine based gas, but is not limited thereto. For example, gas plasma such as hydrogen ($H_2$), argon (Ar), nitrogen ($N_2$), nitrogen oxide ($N_2O$), fluoroform ($CHF_3$), etc. may be used. By performing the plasma reduction process, at least a part of the semiconductor material that constitutes the oxide semiconductor layer 150 is reduced, and as a result, only a metallic bond may remain. Therefore, as illustrated in FIG. 8B, the oxide semiconductor layer 150 is processed for reduction, and the source electrode 173, the drain electrode 175, and the pixel electrode 191, which are conductive, are formed. At the time of the reduction process of the oxide semiconductor layer 150, a metal component of the semiconductor material, which may include, for example, indium (In), may be precipitated at a surface of an upper portion of the oxide semiconductor layer 150. A thickness of the precipitated metal layer may be less than or equal to about 200 nm.

Figure 9:
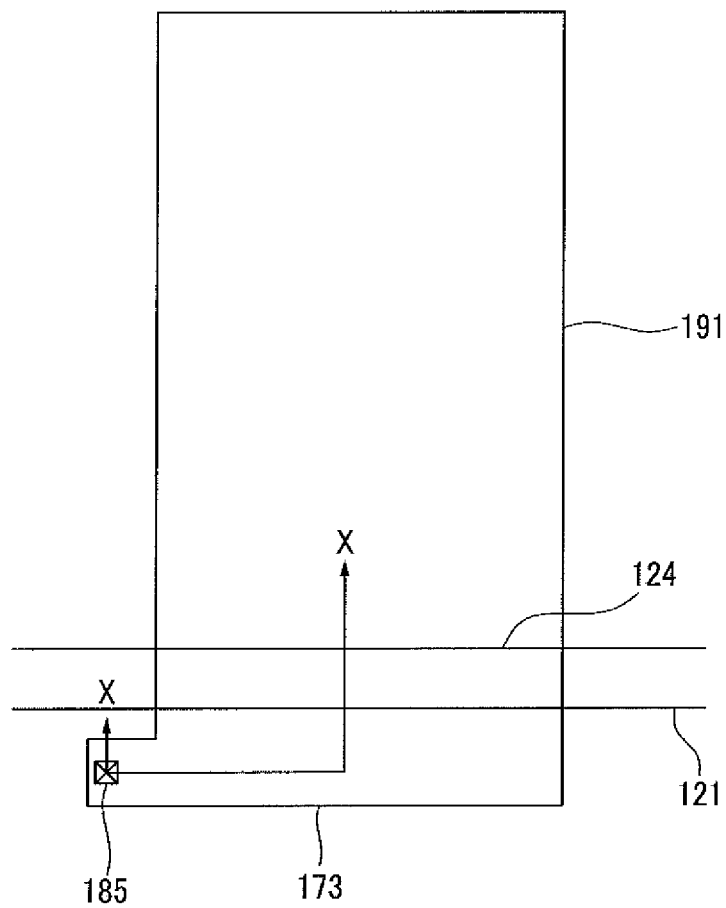
Figure 10:
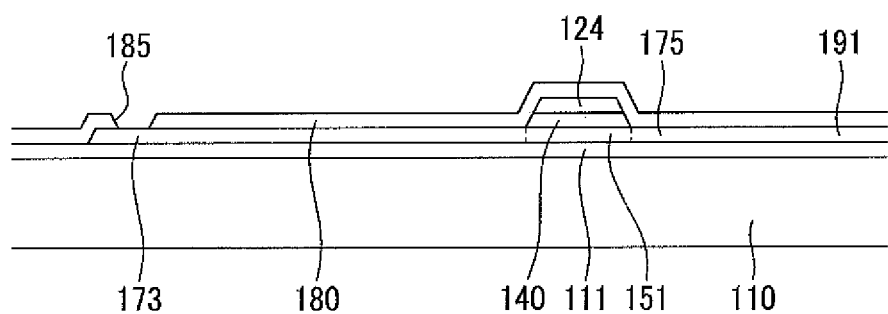
FIG. 10 is a cross-sectional view of the thin film transistor array panel taken along line X-X of FIG. 9, according to an exemplary embodiment of the present invention.

As illustrated in FIGS. 9 and 10, the passivation layer 180 is then laminated on the gate electrode 124, the source electrode 173, the drain electrode 175, and the buffer layer 111, and the contact hole 185 is formed to expose a part of the source electrode 173.

Thereafter, as illustrated in FIGS. 1 and 2, the data line 171 is formed on the passivation layer 180. The data line 171 is electrically connected to the source electrode 173 of the thin film transistor through the contact hole 185 of the passivation layer 180. The contact hole 185 may be formed at a position where the data line 171 is overlapped.

Referring to the thin film transistor array panel formed according to an exemplary embodiment of the present invention as described with reference to FIGS. 3 to 10 and 1 to 2, because the gate electrode 124 of the thin film transistor, which includes the channel layer 151 formed of the oxide semiconductor, is not overlapped with the source electrode 173 or the drain electrode 175, parasitic capacitance between the gate electrode 124 and the source electrode 173, or parasitic capacitance between the gate electrode 124 and the drain electrode 175, may be decreased.

In addition, the width of the channel of the thin film transistor is the same as or substantially the same as the width W of the pixel electrode 191 in a direction parallel to a direction in which the gate line 121 extends. Further, the length of the channel of the thin film transistor is the same as or substantially the same as the width L of the gate electrode 124 of the gate line 121, which is overlapped with the channel layer 151. As a result of the width of the channel of the thin film transistor being increased and the length being decreased, characteristics of the thin film transistor may be improved, and deterioration of an aperture ratio of the thin film transistor array panel may be decreased.

In addition, because the pixel electrode 191 is positioned in the same layer as the channel layer 151 and formed in the same portion of the same layer as the drain electrode 175, the drain electrode 175 and the pixel electrode 191 may be connected to each other without utilization of a contact hole. As a result, deterioration of an aperture ratio of the thin film transistor array panel may be prevented.

Moreover, the contact hole 185 of the passivation layer 180, which connects the source electrode 173 and the data line 171 of the thin film transistor array panel, may be formed at a position where the data line 171 is overlapped. As a result, deterioration of an aperture ratio of a liquid crystal display due to the contact hole 185 may be prevented.

While the present invention has been particularly shown and described with reference to the exemplary embodiments thereof, it is to be understood by those of ordinary skill in the art that various changes in form and detail may be made therein without departing from the spirit and scope of the present invention as defined by the following claims.

What is claimed is:

1. A thin film transistor array panel, comprising:
   a channel layer comprising an oxide semiconductor and formed in a semiconductor layer;
   a source electrode formed in the semiconductor layer and connected to the channel layer at a first side of the channel layer;
   a drain electrode formed in the semiconductor layer and connected to the channel layer at a second side of the channel layer, opposing the first side;
   a pixel electrode formed in the semiconductor layer in a same portion of the semiconductor layer as the drain electrode;
   an insulating layer disposed on the channel layer;
   a gate line comprising a gate electrode disposed on the insulating layer;
   a passivation layer disposed on the source electrode, the drain electrode, the pixel electrode, and the gate line; and
   a data line disposed on the passivation layer,
   wherein a width of the channel layer is substantially equal to a width of the pixel electrode in a direction parallel to the gate line,
   wherein the source electrode, the channel layer, the drain electrode and the pixel electrode are disposed in a same plane extending in a straight line below the gate electrode,
   wherein the insulating layer covers the channel layer and does not extend beyond end portions of the channel layer,
   wherein the insulating layer is not overlapped with the source electrode, the drain electrode, and the pixel electrode, and wherein the source electrode and the drain electrode are not overlapped with the channel layer and the gate electrode.

2. The thin film transistor array panel of claim 1, wherein:
   a length of the channel layer is substantially equal to a width of the gate electrode in a direction parallel to the data line.

3. The thin film transistor array panel of claim 2, wherein:
   the source electrode, the drain electrode, and the pixel electrode comprise a reduced substance reduced from a material of the oxide semiconductor.

4. The thin film transistor array panel of claim 3, wherein:
   an edge boundary of the gate electrode and an edge boundary of the insulating layer are substantially aligned.

5. The thin film transistor array panel of claim 4, wherein:
   the passivation layer comprises a contact hole exposing the source electrode, and
   the data line is connected to the source electrode through the contact hole.

6. The thin film transistor array panel of claim 5, wherein:
   the contact hole is formed at a position where the data line overlaps the passivation layer and the source electrode.

7. The thin film transistor array panel of claim 1, wherein:
   the source electrode, the drain electrode, and the pixel electrode comprise a reduced substance reduced from a material of the oxide semiconductor.

8. The thin film transistor array panel of claim 7, wherein:
   an edge boundary of the gate electrode and an edge boundary of the insulating layer are substantially aligned.

9. The thin film transistor array panel of claim 8, wherein:
   the passivation layer comprises a contact hole exposing the source electrode, and
   the data line is connected to the source electrode through the contact hole.

10. The thin film transistor array panel of claim 9, wherein:
    the contact hole is formed at a position where the data line overlaps the passivation layer and the source electrode.

11. The thin film transistor array panel of claim 1, wherein:
    an edge boundary of the gate electrode and an edge boundary of the insulating layer are substantially aligned.

12. The thin film transistor array panel of claim 11, wherein:
    the passivation layer comprises a contact hole exposing the source electrode, and
    the data line is connected to the source electrode through the contact hole.

13. The thin film transistor array panel of claim 12, wherein:
    the contact hole is formed at a position where the data line overlaps the passivation layer and the source electrode.

14. The thin film transistor array panel of claim 1, wherein:
the passivation layer comprises a contact hole exposing the source electrode, and
the data line is connected to the source electrode through the contact hole.

15. The thin film transistor array panel of claim 14, wherein:
the contact hole is formed at a position where the data line overlaps the passivation layer and the source electrode.

16. A method of manufacturing a thin film transistor array panel, comprising:
forming an oxide semiconductor layer on an insulation substrate;
forming an insulating layer and a gate line comprising a gate electrode on the oxide semiconductor layer;
forming a channel layer, a source electrode, a drain electrode, and a pixel electrode in the oxide semiconductor layer by performing a reduction process on an exposed portion of the oxide semiconductor layer,
wherein the channel layer is covered by the gate electrode, the source electrode is formed at a first side of the channel layer, the drain electrode is formed at a second side of the channel layer, opposing the first side, and wherein the pixel electrode and the drain electrode are formed in a same portion of the oxide semiconductor layer, and the exposed portion of the oxide semiconductor layer is not covered by the insulating layer and the gate line;
forming a passivation layer on the source electrode, the drain electrode, the pixel electrode, and the gate line; and
forming a data line on the passivation layer,
wherein a width of the channel layer is formed to be substantially equal to a width of the pixel electrode in a direction parallel to the gate line,
wherein the source electrode, the channel layer, the drain electrode and the pixel electrode are disposed in a same plane extending in a straight line below the gate electrode,
wherein the insulating layer covers the channel layer and does not extend beyond end portions of the channel layer,
wherein the insulating layer is not overlapped with the source electrode, the drain electrode, and the pixel electrode, and the source electrode and the drain electrode are not overlapped with the channel layer and the gate electrode.

17. The method of claim 16, wherein:
a length of the channel layer is formed to be substantially equal to a width of the gate electrode in a direction parallel to the data line.

18. The method of claim 17, wherein:
forming the source electrode, the drain electrode, and the pixel electrode comprises performing a plasma process on a material of the oxide semiconductor layer to reduce the material.

19. The method of claim 18, wherein:
forming the insulating layer and the gate line comprising the gate electrode comprises
forming the insulating layer comprising an insulating material on the oxide semiconductor layer,
forming the gate line comprising the gate electrode on the insulating layer, and
patterning the insulating layer using the gate electrode as an etching mask.

20. The method of claim 19, wherein:
forming the passivation layer further comprises forming a contact hole in the passivation layer, wherein the contact hole exposes the source electrode, and
forming the data line comprises connecting the source electrode and the data line through the contact hole.

21. The method of claim 20, wherein:
forming the contact hole comprises forming the contact hole at a position where the data line overlaps the passivation layer and the source electrode.

22. The method of claim 16, wherein:
forming the source electrode, the drain electrode, and the pixel electrode comprises performing a plasma process on a material of the oxide semiconductor layer to reduce the material.

23. The method of claim 22, wherein:
forming the insulating layer and the gate line comprising the gate electrode comprises
forming the insulating layer comprising an insulating material on the oxide semiconductor layer,
forming the gate line comprising the gate electrode on the insulating layer, and
patterning the insulating layer using the gate electrode as an etching mask.

24. The method of claim 23, wherein:
forming the passivation layer further comprises forming a contact hole in the passivation layer, wherein the contact hole exposes the source electrode, and
forming the data line comprises connecting the source electrode and the data line through the contact hole.

25. The method of claim 24, wherein:
forming the contact hole comprises forming the contact hole at a position where the data line overlaps the passivation layer and the source electrode.

26. The method of claim 16, wherein:
forming the insulating layer and the gate line comprising the gate electrode comprises
forming the insulating layer comprising an insulating material on the oxide semiconductor layer,
forming the gate line comprising the gate electrode on the insulating layer, and
patterning the insulating layer using the gate electrode as an etching mask.

27. The method of claim 26, wherein:
forming the passivation layer further comprises forming a contact hole in the passivation layer, wherein the contact hole exposes the source electrode, and
forming the data line comprises connecting the source electrode and the data line through the contact hole.

28. The method of claim 27, wherein:
forming the contact hole comprises forming the contact hole at a position where the data line overlaps the passivation layer and the source electrode.

29. The method of claim 16, wherein:
forming the passivation layer further comprises forming a contact hole in the passivation layer, wherein the contact hole exposes the source electrode, and
forming the data line comprises connecting the source electrode and the data line through the contact hole.

30. The method of claim 29, wherein:
forming the contact hole comprises forming the contact hole at a position where the data line overlaps the passivation layer and the source electrode.

* * * * *